United States Patent
Gutfeldt et al.

[11] Patent Number: 5,871,042
[45] Date of Patent: Feb. 16, 1999

[54] LIQUID COOLING APPARATUS FOR USE WITH ELECTRONIC EQUIPMENT

[75] Inventors: Theodor A. Gutfeldt, Berkeley; Bryan L. Clausen, San Jose; Sarosh M. Patel, Sunnyvale, all of Calif.

[73] Assignee: Teradyne, Inc., Boston, Mass.

[21] Appl. No.: 963,723

[22] Filed: Nov. 4, 1997

[51] Int. Cl.[6] ........................................ F28F 3/12
[52] U.S. Cl. ...................... 165/70; 165/80.4; 165/168; 257/714; 361/699
[58] Field of Search .................................. 165/80.4, 168, 165/70, 185; 361/699; 257/714

[56] References Cited

U.S. PATENT DOCUMENTS

| | | | |
|---|---|---|---|
| 2,217,702 | 10/1940 | Kleist | 165/168 X |
| 2,607,203 | 8/1952 | Kleist | 165/170 X |
| 3,617,699 | 11/1971 | Othmer | 165/70 X |
| 4,022,272 | 5/1977 | Miller | 165/185 X |
| 4,090,554 | 5/1978 | Dickinson | 165/70 X |
| 4,607,684 | 8/1986 | Wiard et al. | 165/70 |
| 4,801,778 | 1/1989 | Mizutani et al. | 165/168 X |
| 5,205,348 | 4/1993 | Tousignant et al. | 165/170 X |
| 5,339,892 | 8/1994 | Clifton | 165/168 X |

*Primary Examiner*—Leonard R. Leo
*Attorney, Agent, or Firm*—Flehr Hohbach Test Albritton & Herbert LLP

[57] ABSTRACT

A liquid cooling apparatus for use with electronic equipment includes a frame adapted to fit in a chassis with electronic equipment. An inner container and outer container are attached to the frame. A liquid inlet is disposed in the frame and has an opening in liquid flow communication with the inner container. A liquid outlet is disposed in the frame and has an opening in liquid flow communication with the inner container. A vacuum outlet is disposed in the frame and coupled to a space between the inner container and the outer container. A detector is coupled to the vacuum outlet and configured to detect air and/or liquid escaping from the vacuum outlet. Advantages of the invention include the ability to cool electronic equipment while guarding against accidental leaks in the cooling apparatus. The invention is also applicable to any process or system where thermal transfer is needed and leaks are to be protected against. This includes, but is not limited to, heating, cooling, or stabilizing the temperature of chemical, biological, or physical processes in medical, scientific, testing or processing equipment.

10 Claims, 5 Drawing Sheets

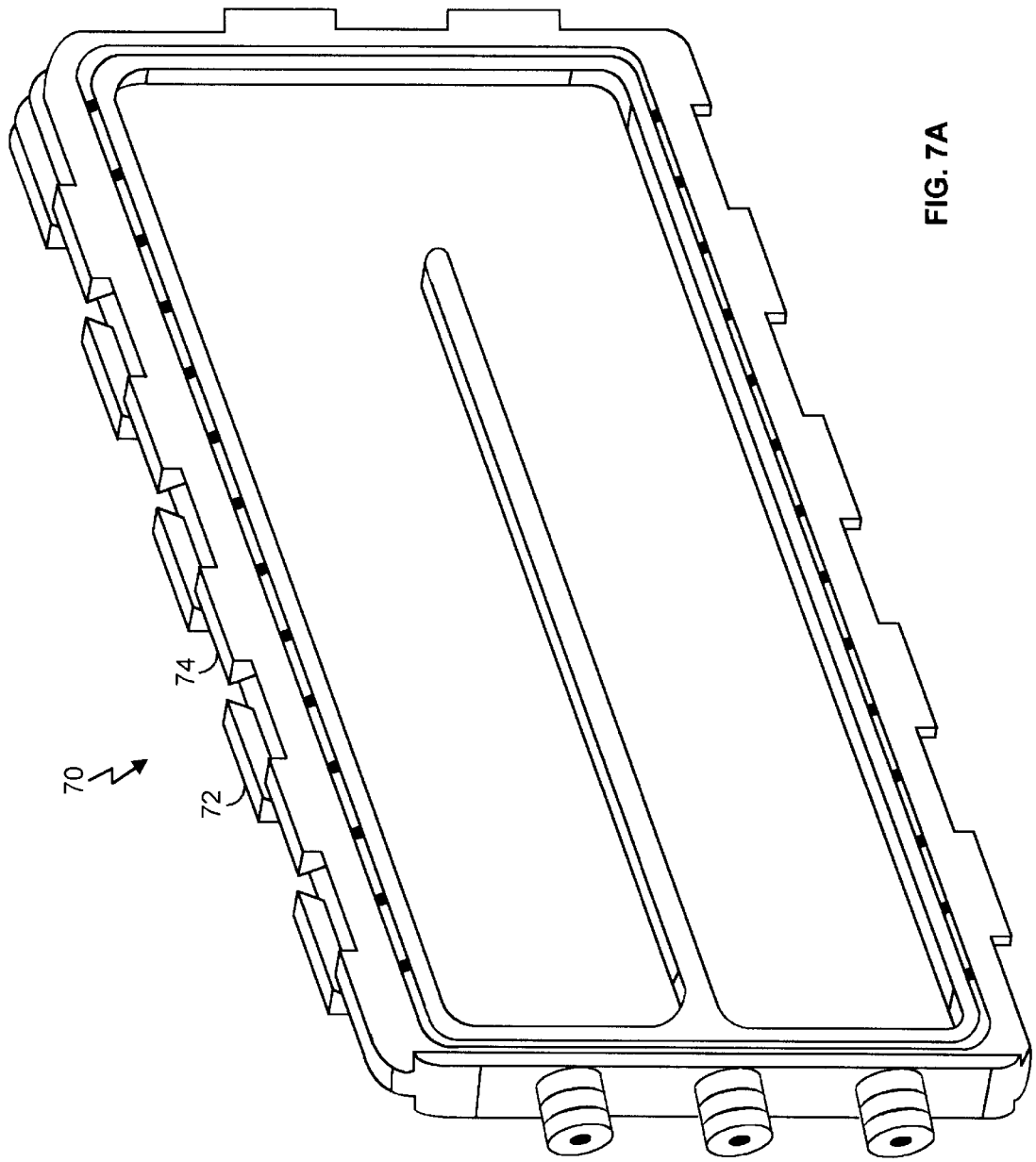

LIQUID COOLING APPARATUS FOR USE WITH ELECTRONIC EQUIPMENT

FIELD

The present invention relates to a liquid cooling apparatus for use with electronic equipment. In particular, the invention is used to cool electronic components and provides access to detect liquid leaks and air leaks, prior to damage taking place, and prevents coolant from leaking. The invention is also applicable to any process or system where thermal transfer is needed and leaks are to be protected against. This includes, but is not limited to, heating, cooling, or stabilizing the temperature of chemical, biological, or physical processes in medical, scientific, testing or processing equipment.

BACKGROUND

Electronic devices are known to generate heat and often require cooling in order to be maintained at an optimum operating temperature. Conventional liquid cooling apparatus are known in the art. Reference is made to conventional apparatus described in U.S. Pat. Nos. 4,109,707; 4,938,279; 4,879,632; 4,997,032; 5,000,256; and 5,040,051. These apparatus typically use a plastic bag or some other type container in which a cooled liquid is circulated. When the container is close to the electronic equipment, the electronic equipment is cooled and can be maintained at an optimum operating temperature.

Electronic equipment, such as printed circuit boards, tends to have sharp protrusions including edges and soldered connections. Moreover, it is known that electronic equipment is very sensitive to liquids since liquids can serve to corrode or short out the electronic components. However, many of the conventional containers employ membranes such as thin plastic that can easily tear. In conventional apparatus, a physical inspection is required to determine whether a leak has occurred. Therefore, a limitation of known apparatus is that they do not offer adequate protection against liquid leaks in order to prevent damage from occurring to the electronic components.

A goal of the invention is to overcome the identified limitations and to provide an apparatus that combines the benefit of liquid cooling and also provides a technique for access to detecting a leak in the cooling apparatus, prior to damage taking place, and protecting electronic components from any leakage.

SUMMARY

The invention overcomes the identified problems and provides a liquid cooling apparatus that combines the benefit of liquid cooling and also provides a technique for access to detecting a leak, prior to damage taking place, in the cooling apparatus. An exemplary embodiment of a liquid cooling apparatus for use with electronic equipment includes a frame adapted to fit in a chassis with electronic equipment. An inner container and outer container are attached to the frame. A liquid inlet is disposed in the frame and has an opening in liquid flow communication with the inner container. A liquid outlet is disposed in the frame and has an opening in liquid flow communication with the inner container. A vacuum outlet is disposed in the frame and coupled to a space between the inner container and the outer container.

In one embodiment, a detector is coupled to the vacuum outlet and configured to detect air and/or liquid escaping from the vacuum outlet. In another embodiment dual films may be sealed to one another with inlet, outlet and vacuum fittings, dispensing the need of a frame.

Advantages of the invention include the ability to cool electronic equipment while guarding against accidental leaks in the cooling apparatus.

BRIEF DESCRIPTION OF THE FIGURES

Additional advantages of the invention will become apparent upon reading the following detailed description and upon reference to the drawings, in which:

FIGS. 7A–D depict a dove-tail construction used to connect cooling modules together according to an embodiment of the invention.

DETAILED DESCRIPTION

Figure 1:
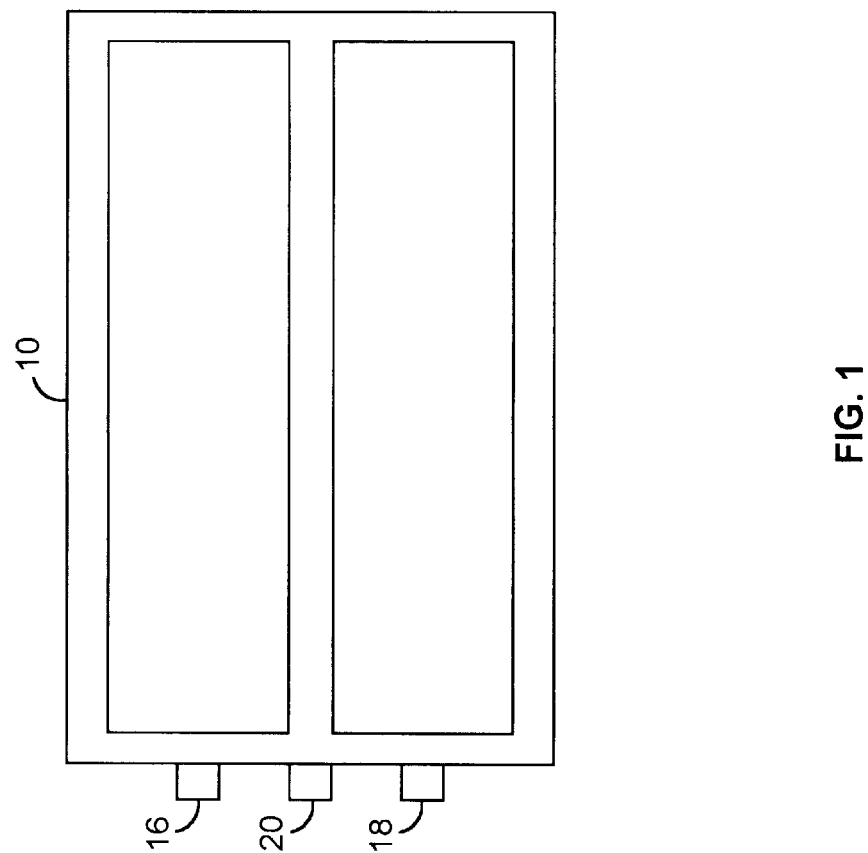
FIG. 1 depicts a liquid cooling apparatus according to an embodiment of the invention.
Figure 2:
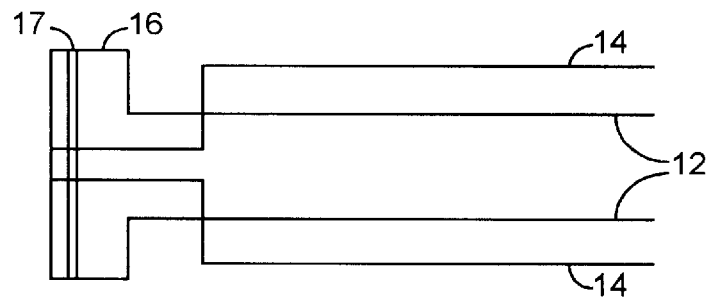
FIG. 2 depicts a liquid inlet according to an embodiment of the invention.
Figure 3:
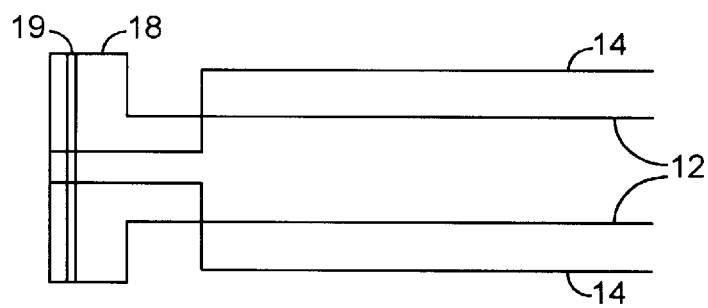
FIG. 3 depicts a liquid outlet according to an embodiment of the invention.
Figure 4:
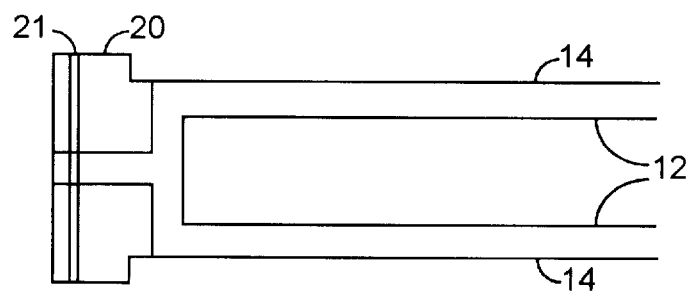
FIG. 4 depicts a vacuum outlet according to an embodiment of the invention.

Exemplary embodiments are described with reference to specific configurations. Those skilled in the art will appreciate that various changes and modifications can be made while remaining within the scope of the claims.

A first embodiment is described with reference to FIGS. 1 to 4. A frame 10 is adapted to fit in a chassis with electronic equipment. For example, the frame is constructed to be approximately 12 inches by 12 inches to fit into a VME style chassis. The frame is constructed to fit into a conventional type chassis slot, and can be constructed to fit into any chassis. The frame is constructed of a material such as a firm plastic or metal or composite materials.

An inner container 12 is attached to the frame. The inner container is constructed of a plastic film that is glued, welded, clamped, or otherwise firmly connected to frame 10. The inner container can also be constructed of materials such as plastics, metals or composite materials.

An outer container 14 is attached to the frame outside of the inner container. The outer container is constructed of a plastic film that is glued, welded, clamped, or otherwise firmly connected to frame 10, leaving a space between inner container 12 and outer container 14. The outer container can also be constructed of a material such as plastic, metal, or composite materials.

A liquid inlet 16 is disposed in the frame and has an opening in liquid flow communication with the inner container. The liquid inlet has an O-ring (or other seal) 17 that provides a good coupling with a liquid supply hose, manifold, or other liquid passage. The liquid inlet is designed to accept liquid from an external pump that provides cool liquid and also provides some pressure to liquid inlet 16.

A liquid outlet 18 is disposed in the frame and has an opening in liquid flow communication with the inner container. The liquid outlet has an O-ring (or other seal) 19 that provides a good coupling with a liquid return hose, manifold, or other passage. The liquid outlet is designed to conduct liquid out from the liquid cooling apparatus to an external structure that recycles the liquid, cools the liquid and pumps the liquid back to liquid inlet 16.

A vacuum outlet 20 is also disposed in the frame and is coupled to a space between the inner container and the outer container. The vacuum outlet has an O-ring (or other seal) 21 that provides a good coupling with a vacuum hose, manifold, or other passage. This provides a technique for recovering any liquid that escapes from the inner container, and detecting leaks. An external vacuum source is combined with a sensor and alarm. A sensor detects whether liquid is being drawn through vacuum outlet 20. The sensor may be an absolute pressure sensor; differential pressure sensor; mass flow sensor such as a heated thermistor; thermocouple, ionization, thermal conductivity, humidity, or other sensor. If liquid is detected, either automatic or manual protection is initiated. Additionally, the pump can be shut down and flow can even be reversed, or negative pressure applied, in order to draw liquid out of the inner container. The sensor also detects whether an air leak is present in the outer container. If the vacuum pressure drops below a predetermined threshold, or mass flow or humidity is detected, either automatic or manual protection is initiated. Again, the pump can be shut down and flow can even be reversed, or negative pressure applied, in order to draw liquid out of the inner container.

Figure 5:
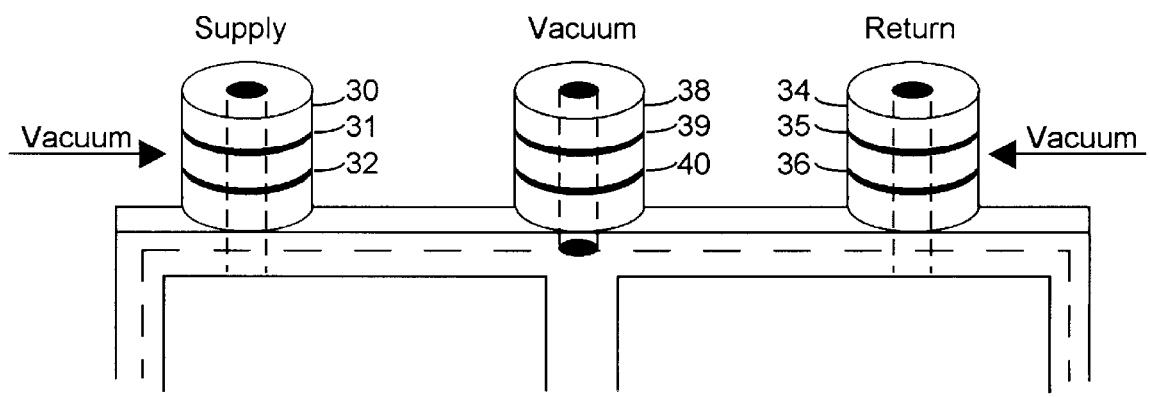
FIG. 5 depicts a liquid cooling apparatus frame, combined liquid inlet and vacuum outlet, and combined liquid outlet and vacuum outlet, and vacuum outlet according to an embodiment of the invention.

A second embodiment is described with reference to FIG. 5. In this embodiment, a liquid inlet 30 includes two O-rings (or other seals) 31 and 32 to improve the sealing reliability and effectiveness. The supply hose, manifold, or other passage, includes an outer sleeve with a vacuum return. If the liquid supply hose, manifold, or other passage, or either seal, develops a leak, the vacuum return will detect liquid or a change in vacuum pressure, mass flow, or humidity, and provide protective initiation.

A liquid outlet 34 includes two O-rings (or other seal) 35 and 36 to improve the sealing reliability and effectiveness. The return hose, manifold, or other passage includes an outer sleeve with a vacuum return. If the liquid return hose, manifold or other passage, or either seal, develops a leak, the vacuum return will detect liquid or a change in vacuum pressure, mass flow, or humidity and provide protective initiation.

A vacuum outlet 38 includes two O-rings (or other seals) 39 and 40 to improve the sealing reliability and effectiveness. Otherwise, the construction of the vacuum outlet for this embodiment is similar to the first embodiment.

Figure 6:
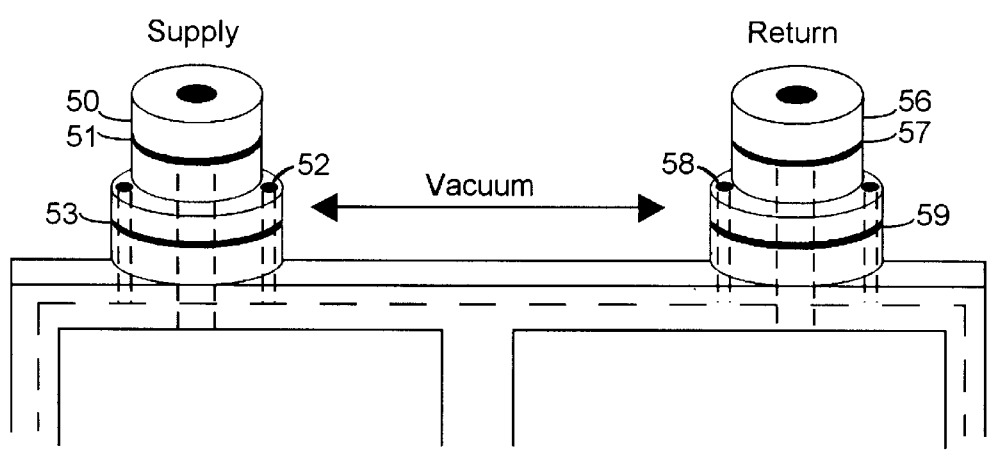
FIG. 6 depicts a liquid cooling apparatus frame, combined liquid include and vacuum outlet, and combined liquid outlet and vacuum outlet according to an embodiment of the invention.

A third embodiment is described with reference to FIG. 6. In this embodiment, a liquid inlet 50 includes a small O-ring (or other seal) 51 and a combined vacuum outlet 52 integrated into a larger diameter fitting and a second O-ring (or other seal) 53 to enclose the vacuum region. The vacuum outlet 52 is coupled to a space between the inner container and the outer container. The supply hose, manifold, or other passage includes an outer sleeve with a vacuum return. If the liquid supply hose, manifold, or other passage, or any seal, develops a leak, the vacuum return will detect liquid or a change in vacuum pressure, mass flow, or humidity, and initiate protective action.

A liquid outlet 56 includes a small O-ring (or other seal) 57 and a combined vacuum outlet 58 integrated into a larger diameter fitting and a second O-ring (or other seal) 59 to enclose the vacuum region. The vacuum outlet 58 is coupled to a space between the inner container and the outer container. The return hose, manifold, or other passage includes an outer sleeve with a vacuum return. If the liquid return hose, manifold, or other passage, or either seal, develops a leak, the vacuum return will detect liquid or a change in vacuum pressure and provide protective initiation.

Figure 7B:
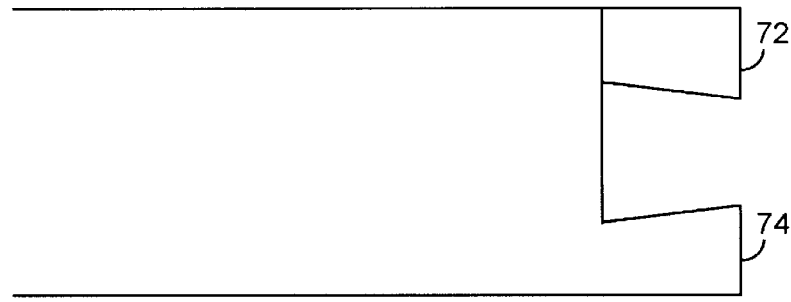
Figure 7C:
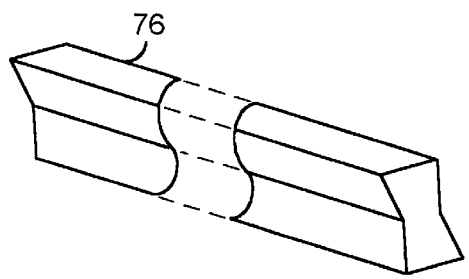
Figure 7D:
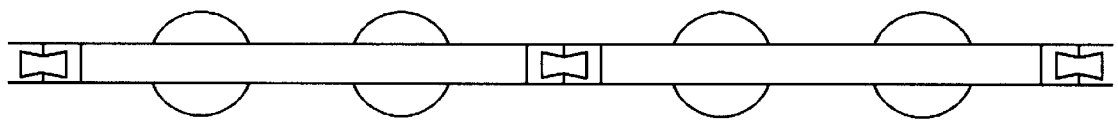

FIGS. 7A–D show how a plurality of frames can be connected together using a dove-tail type of construction, or any type of removable joining apparatus. This allows the frames to be connected and to provide cooling to a large circuit board or other type of electronic equipment. FIG. 7A is a perspective view of a frame having a dove-tail type construction at the edges, indicated by reference number 70. A number of alternating dove-tail type flanges are constructed as indicated by reference numbers 72 and 74. These flanges are adapted to match with adjoining frames. FIG. 7B depicts an end view of the frame edge indicating flanges 72 and 74. FIG. 7C depicts a connecting rod 76 that fits between adjoining frames to lock them in place. Rod 76 can be constructed from any suitable material such as metal or plastic and provides a means for fastening the frames together, and also provides a stiffening member for the frames. FIG. 7D depicts an end view of two adjoining frames locked together with the dove-tail type flanges and a rod. The frames can be locked together both horizontally and vertically.

Examples of parameters that can be used in the invention are an inlet liquid pressure of approximately 5 psi with a 1 psi pressure drop between the liquid inlet and liquid outlet, a liquid flow rate of 0.078 gallons per minute, and a vacuum pressure of 27.5 in. Hg. The liquid used in the invention is water or other suitable liquid cooled to a temperature, for example, of 17° Celsius.

Advantages of the invention include the ability to cool electronic equipment while guarding against accidental leaks in the cooling apparatus.

Having disclosed exemplary embodiments and the best mode, modifications and variations may be made to the disclosed embodiments while remaining within the scope of the invention as defined by the following claims.

What is claimed is:

1. An apparatus for providing thermal transfer with a structure in an ambient fluid environment comprising:

a frame adapted to fit in a chassis with said structure;

an inner container attached to said frame;

an outer container attached to said frame;

a liquid inlet disposed in said frame and having an opening in liquid flow communication with said inner container;

a liquid outlet disposed in said frame and having an opening in liquid flow communication with said inner container;

a vacuum outlet disposed in said frame and coupled to a space between said inner container and said outer container, said vacuum outlet being connected to an external vacuum source; and a detector coupled to said vacuum outlet and configured to detect the ambient fluid or the liquid escaping through said vacuum outlet.

2. The apparatus of claim 1, wherein:

said vacuum outlet is disposed at the periphery of one of said liquid inlet and said liquid outlet.

3. The apparatus of claim 2, further comprising:

a second vacuum outlet disposed in said frame at the periphery of one of said liquid inlet and said liquid outlet and coupled to said space between said inner container and said outer container.

4. The apparatus of claim 1, wherein:

said ambient fluid is air.

5. The apparatus of claim 1, wherein:

said frame includes a dove-tail construction adapted to connect to a second frame.

6. An apparatus for providing thermal transfer with a structure in an ambient fluid environment comprising:

a frame adapted to fit in a chassis with said structure;

an inner container including a film;

an outer container including a film;

a liquid inlet disposed in said inner container and having an opening in liquid flow communication with said inner container;

a liquid outlet disposed in said inner container and having an opening in liquid flow communication with said inner container;

a vacuum outlet disposed between said inner container and said outer container and coupled to a space between said inner container and said outer container, said vacuum outlet being connected to an external vacuum source; and a detector coupled to said vacuum outlet and configured to detect the ambient fluid or the liquid escaping through said vacuum outlet.

7. The apparatus of claim 6, wherein:

said vacuum outlet is disposed at the periphery of one of said liquid inlet and said liquid outlet.

8. The apparatus of claim 7, further comprising:

a second vacuum outlet disposed in said inner container and said outer container at the periphery of one of said liquid inlet and said liquid outlet and coupled to said space between said inner container and said outer container.

9. The apparatus of claim 6, wherein:

said ambient fluid is air.

10. The apparatus of claim 6, wherein:

said inner container and said outer container includes a means adapted to connect to a second inner and outer container.

* * * * *